United States Patent [19]

Susak

[11] Patent Number: 4,829,265
[45] Date of Patent: May 9, 1989

[54] OPERATIONAL AMPLIFIER

[75] Inventor: David M. Susak, Chandler, Ariz.

[73] Assignee: Motorola, Inc., Schaumburg, Ill.

[21] Appl. No.: 197,784

[22] Filed: May 23, 1988

[51] Int. Cl.$^4$ .............................................. H03F 3/45
[52] U.S. Cl. .................................... 330/253; 330/260
[58] Field of Search ................. 330/69, 253, 260, 294

[56] References Cited

U.S. PATENT DOCUMENTS 4,701,718 10/1987 Wrathall et al. .................... 330/253

Primary Examiner—James B. Mullins
Attorney, Agent, or Firm—Michael D. Bingham

[57] ABSTRACT

An operational amplifier includes a first and second input JFETs having gate electrodes which are coupled to first and second input terminals respectively. A single ended output is taken from the drain of one of the JFETs and applied to an output gain stage including a Miller compensation capacitor. Circuitry is provided for producing a low impedance at the drain of the second JFET at high operating frequencies. This circuitry comprises an NPN transistor having an emitter coupled to ground, a base coupled to the drain of the first JFET, and a collector coupled via a resistor to the common sources of the input JFETs. A capacitor is coupled between the collector of the NPN transistor and the drain of the first JFET.

8 Claims, 1 Drawing Sheet

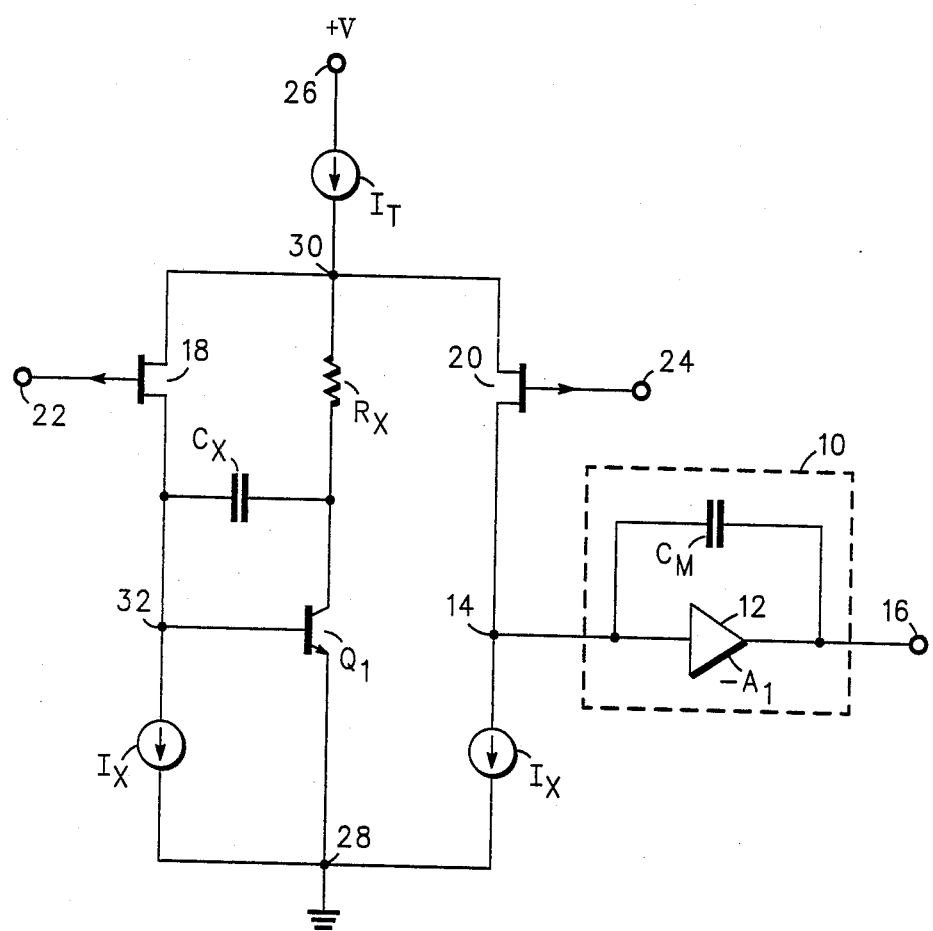

OPERATIONAL AMPLIFIER

BACKGROUND OF THE INVENTION

This invention relates generally to operational amplifier circuits and, more particularly, to an input stage including junction field-effect-transistors (JFETs) for use in a low-noise, high-frequency operational amplifier.

A typical JFET input stage for an operational amplifier includes first and second differential input JFETs which drive a bipolar current mirror. This arrangement has been satisfactory for operation at reasonable speeds. However, to be suitable for low noise applications, the effective source resistance for each of the JFETs must be relatively low (e.g. 500 ohms). This requires large JFET devices and large currents flowing into the bipolar mirror which produce noise currents which are reflected back into the JFETs and become very significant at low frequencies (e.g. 10 Hz). To reduce this problem, JFET input stages have been designed wherein the bipolar current mirror is replaced by other circuitry including bipolar transistors; however, their emitter-collector paths are not in series with the JFETs and therefore need only conduct small currents resulting in very small noise currents. While this arrangement reduces noise, the JFETs must drive high impedance nodes resulting in high gain from the gate to drain. The gate/drain parasitic capacitance of each JFET is multiplied by this high gain of the JFET forming a pole at the gate which substantially degrades the frequency performance of the circuit.

SUMMARY OF THE INVENTION

It is an object of the present invention to provide an improved operational amplifier.

It is a further object of the present invention to provide an improved JFET input stage for operational amplifiers.

It is a still further object of the present invention to provide a JFET input stage for a low noise high frequency operational amplifier.

According to a broad aspect of the invention there is provided an operational amplifier having first and second input terminals and comprising an output stage including the traditional Miller compensation capacitor. A first JFET has a source coupled to a first power supply terminal, a gate coupled to a first input terminal and has a drain. A second JFET has a source coupled to the first power supply terminal and to the source of the first JFET, a gate coupled to the second input terminal, and a drain coupled to the input of the output stage and to a second power supply rail. Means coupled between the sources of the first and second JFETs and a second power supply terminal are provided for producing a low impedance at the drain of the first JFET at high operating frequencies and a high impedance at the drain of the first JFET at low operating frequencies. This means includes an NPN transistor having a collector coupled through a resistor $R_x$ to the sources of the first and second JFETs and to the first power supply terminal. The transistor has an emitter coupled to the second power supply terminal and a base coupled to the drain of said first JFET. A capacitor $C_x$ is coupled between the collector of the transistor and the drain of the first JFET.

BRIEF DESCRIPTION OF THE DRAWINGS

The above and other objects, features and advantages of the present invention will be more clearly understood from the following detailed description taken in conjunction with the accompanying drawing which is a schematic diagram of the inventive operational amplifier.

DESCRIPTION OF THE PREFERRED EMBODIMENT

Referring to the drawing, the inventive operational amplifier includes an output stage 10 comprised of gain stage 12 having an input coupled to node 14 and an output coupled to output terminal 16. A Miller compensation capacitor $C_m$ has a first terminal coupled to the input of gain stage 12 and a second terminal coupled to the output of gain stage 12.

The operational amplifier's input stage includes first and second junction field-effect-transistors (JFETs) 18 and 20 having their gate terminals coupled to input terminals 22 and 24 respectively. The sources of JFETs 18 and 20 are coupled together and via a current source $I_T$ to a first source of supply voltage +V at terminal 26. The drain of JFET 20 is coupled to node 14 and via current source $I_x$ to a second source of supply voltage (e.g. ground) at node 28.

An NPN transistor Q1 has its collector coupled via resistor $R_x$ to node 30, its emitter coupled to node 28 and its base coupled to node 32 (i.e. the drain of JFET 18). A capacitor $C_x$ is coupled between the collector of transistor Q1 and node 32, and a second current source $I_x$ is coupled between node 32 and node 28.

The circuit operates as follows. It can be assumed that input terminal 22 is placed at a reference voltage and that the voltage at input terminal 24 can vary. In its normal mode of operation, as the voltage at input terminal 24 decreases, the current flowing in the drain of JFET 20 will increase. When this current exceeds $I_x$, current ill flow into the input of gain stage 12 causing the output to fall. In contrast, when the voltage at input terminal 24 increases, the current flowing in the drain of JFET 20 will decrease. When this current falls below $I_x$, current will be pulled out of the input of gain stage 12 causing the output to rise.

As was stated previously, the prior art circuits were characterized by poor frequency performance. The inventive circuit solves this problem by rendering nodes 14 and 32 low impedance at high frequencies. At node 14, this occurs as follows. The gain stage 12 has a high gain ($A_1$) associated therewith out to high frequencies. This produces a dominant pole at node 14 with an effective capacitance of $A_1 C_m$ where $A_1$ is the gain of gain stage 12 and $C_m$ is the capacitance of the Miller capacitor. This effectively reduces the impedance at node 14 at high frequencies.

While node 32 is at a high impedance at low frequencies, it exhibits a low impedance at high frequencies for reasons which will now be described. Transistor Q1 has a high gain associated therewith out to high frequencies when $R_x >> r_e$ where $r_e$ is the effective emitter resistance of transistor Q1. This produces a dominant pole at node 32 with an effective capacitance of $A_z C_x$ where $A_z$ is $R_x/r_e$. Therefore, the impedance at node 32 will roll off with increased frequency.

The circuit shown in the drawing is not only characterized by low noise and high frequency operation, but the gain bandwidth product is also enhanced. For example, it can be shown that at low frequencies, the gain bandwidth product is equal to $g_m/C_m$ where $g_m$ is the transconductance of the JFETs and $C_m$ is a Miller capacitance. At high frequencies, the gain bandwidth product becomes $g_m/2C_m$. Thus, there is more gain available for operation at lower frequencies.

The above description is given by way of example only. Changes in form and details may be made by one skilled in the art without departing from the scope of the invention as defined by the appended claims.

I claim:

1. An operational amplifier having first and second input terminals, comprising:
    an output stage having an input and an output;
    a first capacitor having a first terminal coupled to said input and a second terminal coupled to said output;
    a first JFET having a source coupled to a first power supply terminal, a gate coupled to said first input terminal and having a drain;
    a second JFET having a source coupled to said first power supply terminal and to the source of said first JFET, a gate coupled to said second input, and a drain coupled to the input of said output stage and to a second power supply terminal; and
    first means coupled between the sources of said first and second JFETs and said second power supply terminal for producing a low impedance at the drain of said first JFET at high operating frequencies.

2. An operational amplifier according to claim 1 wherein said first means comprises:
    an NPN transistor having an emitter coupled to said second power supply terminal, a base coupled to the drain of said first JFET and having a collector;
    a second capacitor having a first terminal coupled to the collector of said transistor and a second terminal coupled to the drain of said first JFET; and
    a resistor having a first terminal coupled to the collector of said transistor and to the first terminal of said second capacitor and having a second terminal coupled to the sources of said first and second JFETs.

3. An operational amplifier according to claim 2 further comprising:
    a first current source having a first terminal coupled to said first power supply terminal and having a second terminal coupled to the sources of said first and second JFETs and to the second terminal of said resistor.

4. An operational amplifier according to claim 3 further comprising:
    a second current source coupled between the drain of said first JFET and said second power supply terminal for conducting a current $I_x$; and
    a third current source coupled between the drain of said second JFET and said second power supply terminal for conducting a current $I_x$.

5. An improved JFET input stage for an operational amplifier of the type which includes an output stage having an input and an output and a first capacitor having a first terminal coupled to said input and a second terminal coupled to said output, said input stage comprising:
    a first JFET having a source coupled to a first power supply terminal, a gate coupled to a first input terminal of said input stage and having a drain;
    a second JFET having a source coupled to said first power supply terminal and to the source of said first JFET, a gate coupled to a second input terminal of said input stage, and a drain coupled to the input of said output stage and to a second power supply terminal; and
    first means coupled between the sources of said first and second JFETs and said second power supply terminal for producing a low impedance at the drain of said first JFET at high operating frequencies.

6. An improved input stage according to claim 5 wherein said first means comprises:
    an NPN transistor having an emitter coupled to said second power supply terminal, a base coupled to the drain of said first JFET and having a collector;
    a second capacitor having a first terminal coupled to the collector of said NPN transistor and a second terminal coupled to the drain of said first JFET; and
    a resistor having a first terminal coupled to the collector of said NPN transistor and a second terminal coupled to the sources of said first and second JFETs.

7. An improved input stage according to claim 6 further comprising a first current source having a first terminal coupled to said first power supply terminal and having a second terminal coupled to the sources of said first and second JFETs.

8. An improved input stage according to claim 7 further comprising:
    a second current source coupled between the drain of said first JFET and said second power supply terminal for conducting a current $I_x$; and
    a third current source coupled between the drain of said second JFET and said second power supply terminal for conducting a current $I_x$.

* * * * *